(12) United States Patent
Shibata (10) Patent No.: US 10,020,289 B2
(45) Date of Patent: *Jul. 10, 2018

(54) LAYOUT OF TRANSMISSION VIAS FOR MEMORY DEVICE

(71) Applicant: Micron Technology, Inc., Boise, ID (US)

(72) Inventor: Kayoko Shibata, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/661,846

(22) Filed: Jul. 27, 2017

(65) Prior Publication Data
US 2018/0005995 A1 Jan. 4, 2018

Related U.S. Application Data

(63) Continuation of application No. 15/198,647, filed on Jun. 30, 2016, now Pat. No. 9,761,564.

(51) Int. Cl.
*H01L 25/065* (2006.01)
*G11C 11/4091* (2006.01)

(52) U.S. Cl.
CPC ...... *H01L 25/0657* (2013.01); *G11C 11/4091* (2013.01); *H01L 2225/06513* (2013.01); *H01L 2225/06544* (2013.01); *H01L 2225/06555* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,956,916 | B2* | 2/2015 | Haba | H01L 25/0652 438/108 |
| 9,424,954 | B2* | 8/2016 | Kim | G11C 29/006 |
| 2007/0194455 | A1 | 8/2007 | Ikeda et al. | |
| 2008/0122064 | A1* | 5/2008 | Itoh | H01L 23/50 257/691 |
| 2009/0200680 | A1* | 8/2009 | Shinohara | G11C 5/02 257/773 |
| 2010/0020583 | A1 | 1/2010 | Kang et al. | |
| 2012/0088332 | A1 | 4/2012 | Lee et al. | |
| 2014/0217616 | A1 | 8/2014 | Choi | |

(Continued)

OTHER PUBLICATIONS

U.S. Appl. No. 15/198,647, entitled: "Layout of Transmission vias for Memory Device", filed Jun. 30, 2016, pp. all.

*Primary Examiner* — Mamadou Diallo
(74) *Attorney, Agent, or Firm* — Dorsey & Whitney LLP (57) ABSTRACT

Apparatuses and methods for supplying power to a plurality of dies are described. An example apparatus includes: a substrate; first, second and third memory cell arrays arranged in line in a first direction in the substrate; a first set of through electrodes arranged between the first and second memory cell arrays, each of the first set of through electrodes penetrating through the substrate, the first set of through electrodes including first and second through electrodes; and a second set of through electrodes arranged between the second and third memory cell arrays, each of the second set of through electrodes penetrating through the substrate, the second set of through electrodes including third and fourth through electrodes.

18 Claims, 11 Drawing Sheets

(56) References Cited

U.S. PATENT DOCUMENTS

| | | |
|---|---|---|
| 2015/0008588 A1 | 1/2015 | Kim et al. |
| 2015/0116968 A1 | 4/2015 | Yamada et al. |
| 2015/0222364 A1 | 8/2015 | Hwang et al. |
| 2015/0279825 A1 | 10/2015 | Kang et al. |
| 2015/0371970 A1 | 12/2015 | Sakurada |
| 2016/0035705 A1 | 2/2016 | Watanabe |
| 2017/0220293 A1* | 8/2017 | Kim ..................... G06F 3/0638 |

* cited by examiner

LAYOUT OF TRANSMISSION VIAS FOR MEMORY DEVICE

CROSS-REFERENCE TO RELATED APPLICATION(S)

This application is a continuation of U.S. patent application Ser. No. 15/198,647, filed Jun. 30, 2016, issued as U.S. Pat. No. 9,761,564 on Sep. 12, 2017. The afore-mentioned application and patent are incorporated herein by reference, in their entirety, for any purpose.

BACKGROUND

High data reliability, high speed of memory access, lower power consumption and reduced chip size are features that are demanded from semiconductor memory. In recent years, three-dimensional (3D) memory devices by stacking dies vertically stacked and interconnecting the dies using through-silicon vias (TSVs) have been introduced. Benefits of the 3D memory devices include a plurality of core chips stacked with a large number of vertical vias between the plurality of core chips and an interface chip and the memory controller, which allow wide bandwidth buses with high transfer rates between functional blocks in the plurality of core chips and the interface chip, and a considerably smaller footprint. Thus, the 3D memory devices contribute to large memory capacity, higher memory access speed and chip size reduction. The 3D memory devices include Hybrid Memory Cube (HMC) and High Bandwidth Memory (HBM).

The large number of vertical vias may transfer a clock signal, memory cell data and command sequences for controlling the core chips simultaneously in a manner that the plurality of core chips can be operated independently and simultaneously at high transfer rates. Here, a plurality of input/output channels on the core chips are not necessarily synchronous to each other. To accommodate such operation, the 3D memory device may include a large number of circuits that may operate simultaneously, which causes simultaneous power consumption throughout the device. In particular, the 3D memory device may allow a plurality of memory core chips to operate similar operations throughout circuits on each memory core chip simultaneously at high transfer rates while allowing the interface chip in the 3D memory device to transfer data high rates simultaneously. Simultaneous power consumption throughout the 3D memory device may cause a considerable voltage drop at portions of the large number of circuits having high wiring resistance with respect to a power supply source. This voltage drop may cause unstable operations at the portions of the large number of circuits.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
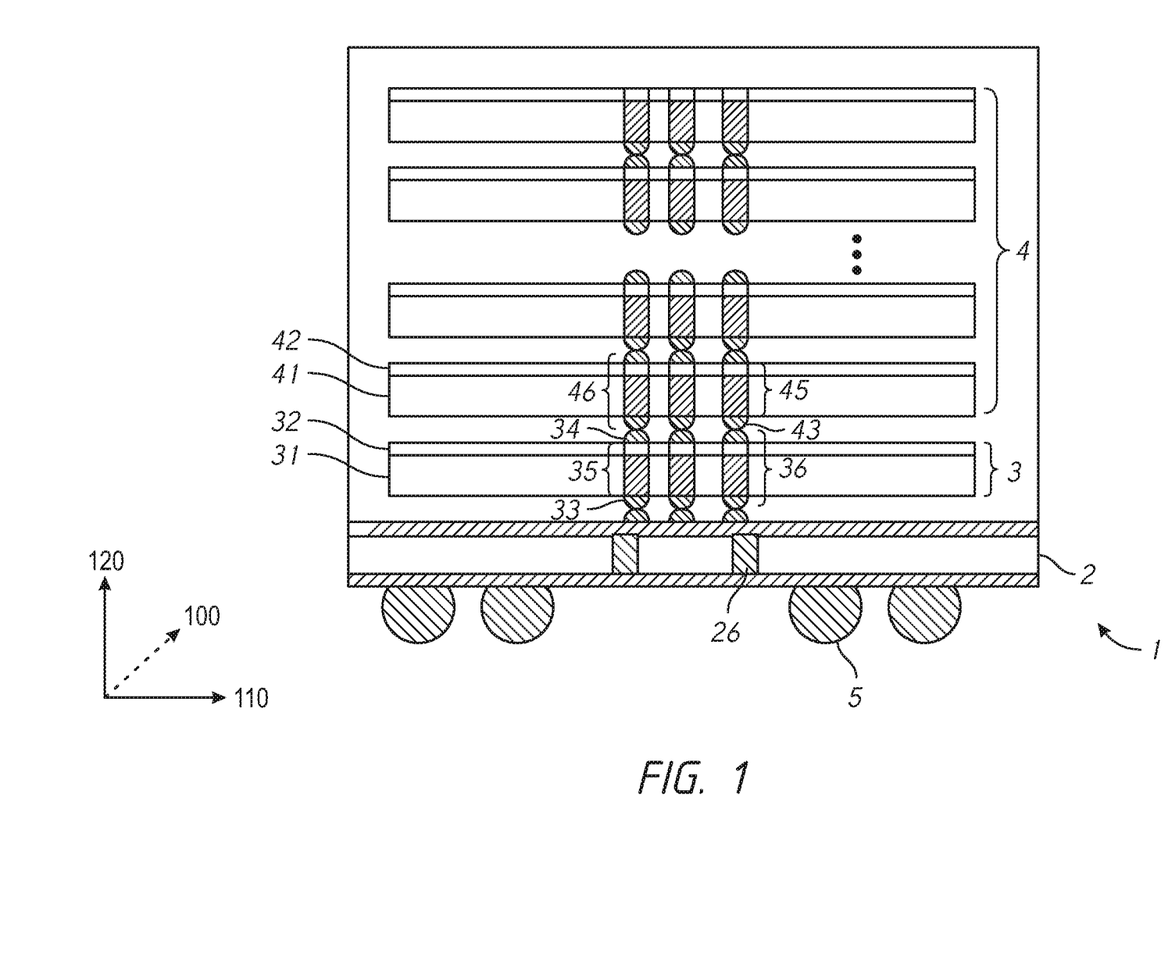
FIG. 1 is a schematic diagram of a semiconductor device including an interface chip and a plurality of core chips in accordance with an embodiment of the present disclosure.

FIG. 1 is a schematic diagram of a semiconductor device including an interface chip and a plurality of core chips in accordance with an embodiment of the present disclosure. As shown in FIG. 1, a semiconductor device 1 may include an interface (I/F) chip 3 and a plurality of core chips 4 stacked on the I/F chip 3. The I/F chip 3 may be stacked on a substrate 2. The semiconductor device 1 may include one or more external terminals 5 (e.g., one or more pads) which may receive external signals and provide the external signals to internal signal wirings 26 of the substrate 2.

For example, each of the I/F chip 3 and the plurality of core chips 4 may extend on a plane defined by a first direction 100 and a second direction 110 that is perpendicular to the first direction 100. The I/F chip 3 and the plurality of core chips 4 may be stacked in a third direction 120 that is perpendicular to the first direction 100 and the second direction 110. The I/F chip 3 may include a substrate layer 31 and a wiring layer 32. The I/F chip 3 includes a plurality of through wirings 36. For example, each of the plurality of through wirings 36 includes a through electrode (TSV) 35 in the substrate layer 31. For example, each of the plurality of through wirings 36 includes a substrate terminal 33 on a side of the substrate 2 which couples the substrate 2 to the TSV 35. The I/F chip 3 may include an external input/output circuit (not shown) that is coupled to a plurality of substrate terminals 33. The external input/output circuit transmits signals from/to the outside of the semiconductor device 1 through the substrate 2. For example, each of the plurality of through wirings 36 includes an interface (IF) terminal 34 (e.g., surface bump) on a side of the plurality of core chips 4 which couples the TSV 35 to a corresponding interface (IF) terminal 43 of one of the plurality of core chips 4 facing the I/F chip 3. The I/F chip 3 may also include an internal signal input/output circuit (not shown) that is coupled to a plurality of IF terminals 34. The internal signal input/output circuit transmits data to/from the core chips 4.

Each of the plurality of core chips 4 may include a substrate layer 41 and a wiring layer 42. Each of the plurality of core chips 4 includes a large number of memory cells (not shown, e.g., dynamic random access memory). Each of the plurality of core chips 4 may include memory cell peripheral circuits (not shown, e.g., sense amplifiers and address decoders), timing control circuits for adjusting operation timings of the memory cell peripheral circuits, input/output circuits relative to the I/F chip 3, test circuits for defect detection in a wafer test for core chips. Each of the plurality of core chips 4 may include a plurality of through wirings 46. Each of the plurality of through wirings 46 may include one or more interface (IF) terminals 43 and a plurality of through electrodes 45.

Figure 2A:
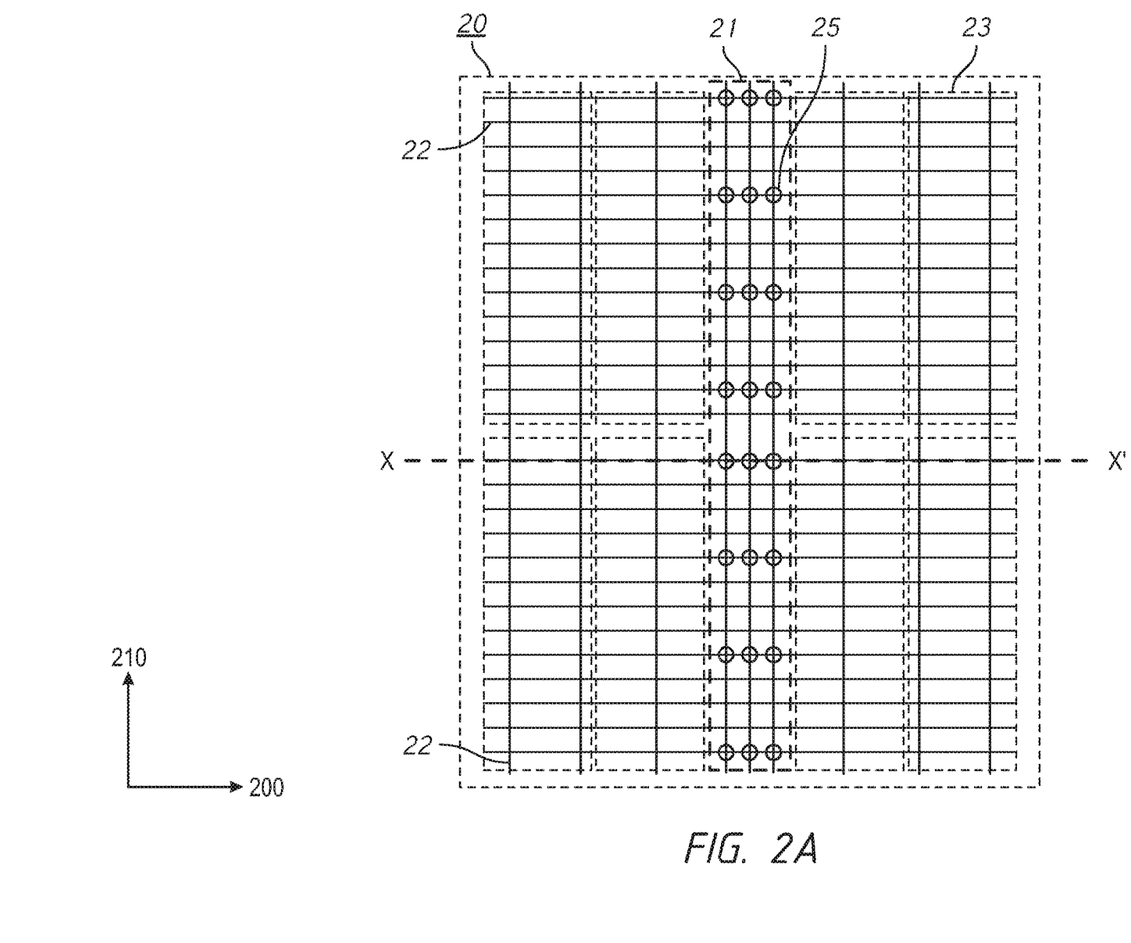
FIG. 2A is a simplified layout diagram of a chip including through electrodes in a semiconductor device, in accordance with an embodiment of the present disclosure.

A power supply (e.g., a positive supply voltage $V_{DD}$, a negative supply voltage $V_{SS}$) for operations of the plurality of core chips 4 is supplied to the I/F chip 3 from an external terminal 5 coupled to a power supply source (not shown), and further supplied to the plurality of core chips 4 through power supply through electrodes 35 and 45. FIG. 2A is a simplified layout diagram of a chip 20 including through electrodes 25 in the semiconductor device 1, in accordance with an embodiment of the present disclosure. The chip 20 may be the I/F chip 3 or the core chip 4. When the chip 20 is the core chip 4, memory cell arrays 23 represented by squares of dotted lines may be disposed on the chip 20. The through electrodes 25 may be power supply through electrodes 35 or 45 on the I/F chip 3 or the core chip 4, respectively. The chip 20 may include the through electrodes 25 disposed in an area 21 at the center of the chip 20. In this example, the area 21 may be between the memory cell arrays 23 and aligned to the memory cell arrays 23 along a first direction 200. The area 21 may extend in a second direction 210 perpendicular to the first direction 200. Power supply wirings 22 are coupled to the through electrodes 25 on the chip 20. The power supply wirings 22 may be represented by solid lines in horizontal and vertical directions on the chip 20.

Figure 2B:
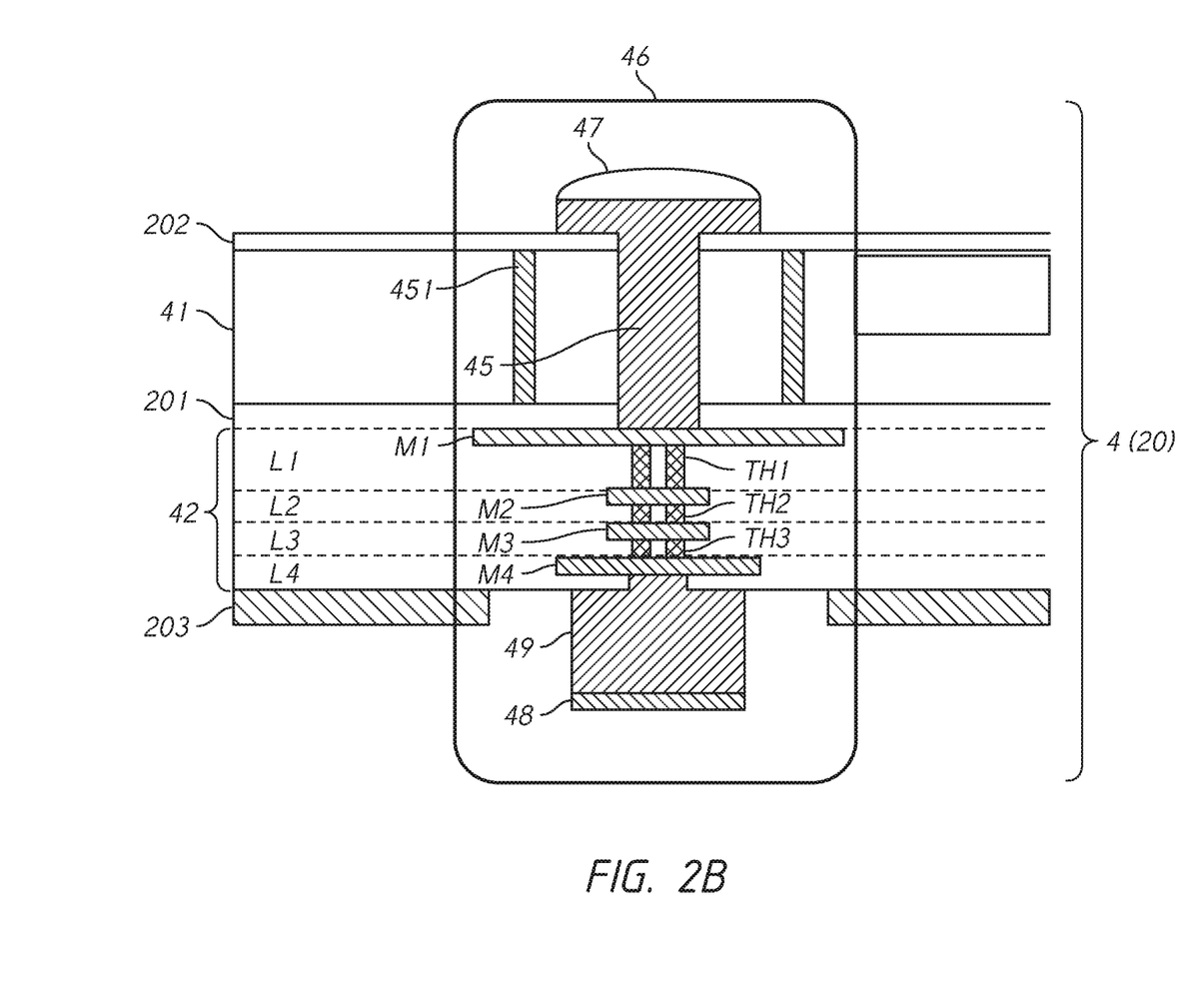
FIG. 2B is a schematic diagram of a through electrode in a core chip of the semiconductor device, in accordance with an embodiment of the present disclosure.

FIG. 2B is a schematic diagram of a through electrode in a core chip of the semiconductor device, in accordance with an embodiment of the present disclosure. In particular, FIG. 2B shows a cross-sectional view of the through wiring 46 including the through electrode (TSV) 45 through a substrate layer 41, an interlayer insulation film 201, which is provided on a surface (e.g., a back surface) of the substrate layer 41, and a passivation film 202, which is provided on a surface (e.g., a top surface) of the substrate layer 41, and surface bumps 47 and 48 that are provided at the same location as the through electrode 45 in planar view. For example, the through electrode 45 may be made of conductive material, such as copper or the like. The back surface of the substrate 41 will be a multi-level wiring structure 42 including wiring layers L1 to L4. Around the through electrode 45, insulation wall 451 is provided to insulate the through electrode 45 from a transistor region. The insulation wall 451 can be provided as an insulation ring or an insulation film such as silicon oxide film around the through electrode 45.

An end portion of the through electrode 45 may be covered with the surface bump 47 that may be in contact with the other surface bump 48 of another core chip, respectively. For example, the surface bump 47 covers the surfaces of the through electrode 45. The through wiring 46 may also include interconnection pads M1 to M4 provided at the wiring layers L1 to L4 respectively, and a plurality of through-hole conductors TH1 to TH3, which couple the interconnection pads M1 to M4. The surface bump 48 is connected to an end portion of the through electrode 45 via the interconnection pads M1 to M4 and the plurality of through-hole conductors TH1 to TH3. For example, the surface bump 48 may include a pillar portion 49 made of conductive material which passes through a passivation film 203. The connection to internal circuits not shown in FIG. 2B may be provided by interconnection lines (not shown), which couple the interconnection pads M1 to M3 to the internal circuits provided in the wiring layers L1 to L3. Accordingly, input signals (command signals, address signals, and other signals) that are supplied from another chip (e.g., the interface chip IF) to the core chips via the through electrodes 45 that are provided to the core chips. Output signals (e.g., data signals) from the core chips may be provided via the through electrodes 45 to the interface chip IF.

Figure 2C:
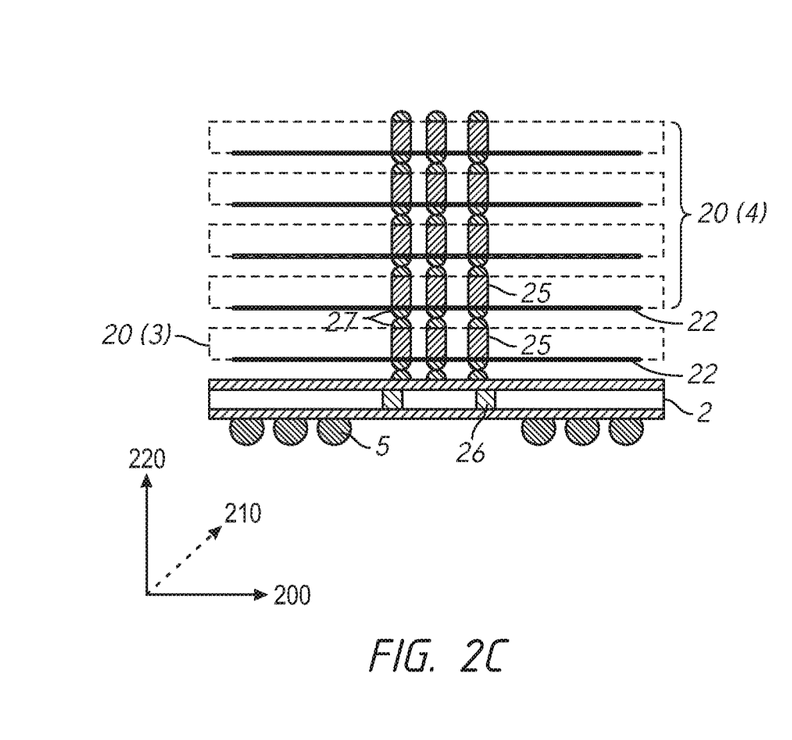
FIG. 2C is a schematic diagram of the semiconductor device including an interface chip and a plurality of core chips in FIG. 2A.

FIG. 2C is a schematic diagram of the semiconductor device including an interface chip and a plurality of core chips in FIG. 2A. FIG. 2C is a cross-sectional view of a portion of the semiconductor device indicated by X-X' of FIG. 2A. A plurality of chips 20 (e.g., the I/F chip 3 and the plurality of core chips 4) may be stacked in a third direction 220 that is perpendicular to the first direction 200 and the second direction 210 in FIG. 2A. The cross-sectional view includes cross sections of the power supply through electrodes 25 disposed in the area 21 of FIG. 2A. The power supply through electrodes 25 may supply power supply voltage from the external terminals 5 through the substrate wirings 26 of the substrate 2 to the plurality of chips 20. The plurality of power supply through electrodes 25 may be coupled by a plurality of terminals 27 in a series in a direction perpendicular to planes of the plurality of chips 20. For example, the plurality of terminals 27 may be the IF terminals 34 and 43 coupling the plurality of power supply through electrodes 25. The power supply through electrodes 25 may supply the power supply voltage to the plurality of chips 20 through the power supply wirings 22.

Figure 2D:
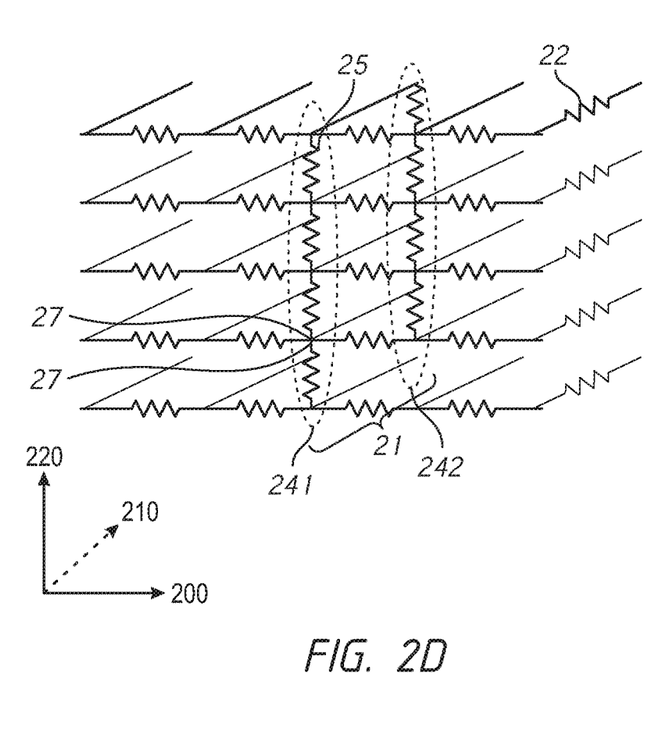
FIG. 2D is a schematic view of the power supply through electrodes and the power supply wirings in FIGS. 2A and 2B.

FIG. 2D is a schematic view of the power supply through electrodes 25 and the power supply wirings 22 in FIGS. 2A and 2C. In FIG. 2D, each of the power supply through electrodes 25 and the power supply wirings 22 may be modeled as a resistor. Each of the resistor groups 241 and 242 may include the plurality of power supply through electrodes 25 and a plurality of terminals 27 in the area 21.

The plurality of power supply through electrodes 25 are coupled in series along the third direction 220. The power supply through electrodes 25 is made of conducting material (e.g., copper) and the resistance of the power supply through electrodes 25 is substantially low (e.g., approximately zero). The resistance of the power supply wirings 22 may also be extremely low (e.g., approximately 0.05 ohm). There may be low resistance at a connection point of the terminals 27 with the power supply wirings 22 on the chip 20. The semiconductor device 1 may include a large number of the through electrodes 25, where the resistance of each of the resistor groups 241 and 242 may be substantially low (e.g., approximately zero) due to high conductivity of the conductive material. Each of the power supply wirings 22 may be provided to have a width that minimizes the resistance inside the chip 20, while supplying a sufficiently level of power supply voltage to circuits.

Figure 3A:
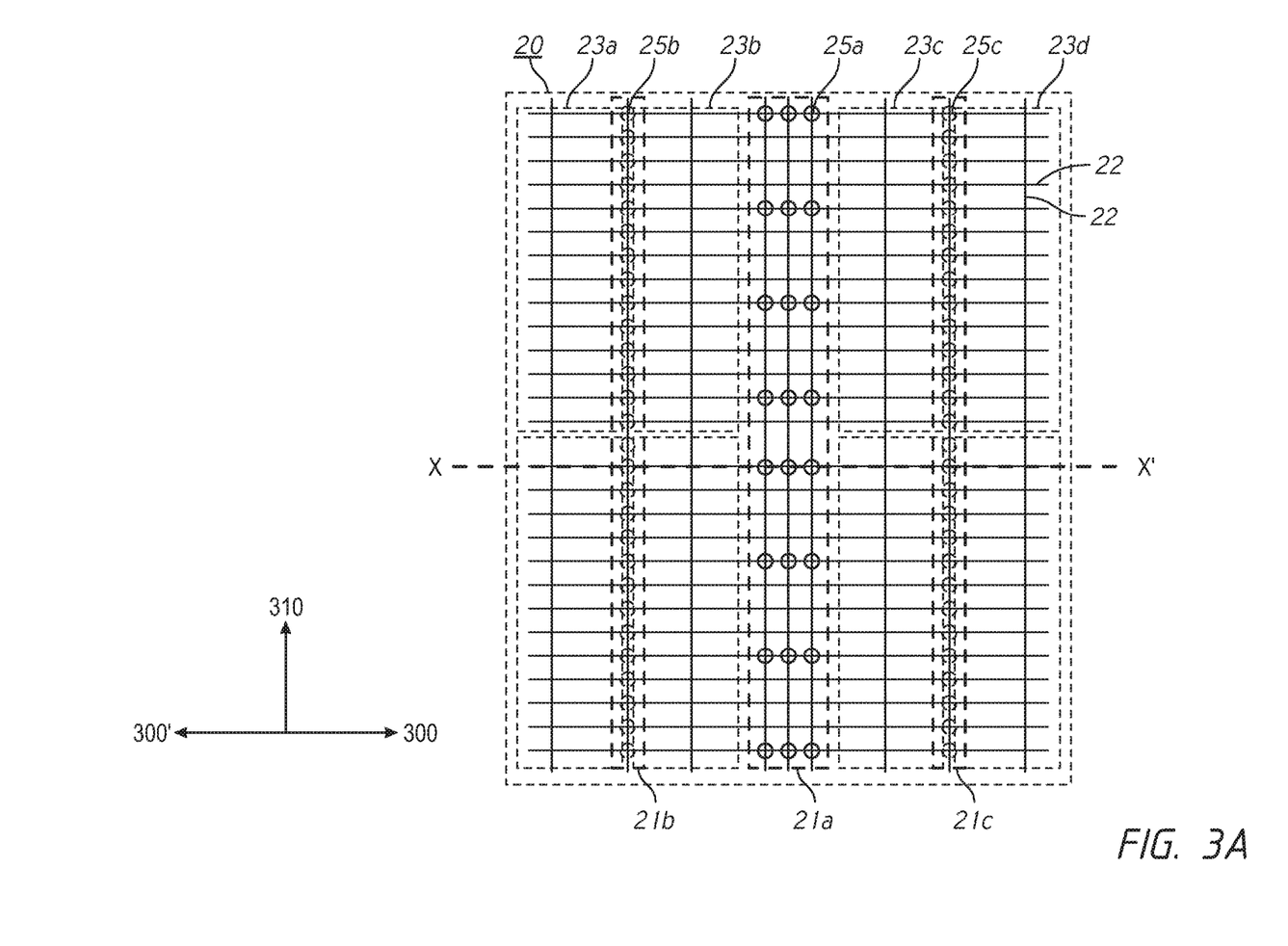
FIG. 3A is a simplified layout diagram of a chip including through electrodes in a semiconductor device, in accordance with an embodiment of the present disclosure.

FIG. 3A is a simplified layout diagram of a chip including through electrodes in a semiconductor device, in accordance with an embodiment of the present disclosure. Description of components corresponding to components included in FIG. 2A will not be repeated and changes from FIG. 2A including positional relationships between the components will be described. For example, the chip 20 may include the through electrodes 25a to 25c disposed in areas 21a to 21c on the chip 20. The through electrodes 25a to 25c may be for power supply and coupled to the power supply wirings 22. In this example, the chip 20 may include memory cell arrays 23a to 23d represented by squares of dotted lines, which are aligned along a first direction 300. The area 21a may be disposed between the memory cell arrays 23b and 23c, adjacent to the memory cell array 23b and aligned to the memory cell array 23b along the first direction 300. The area 21a may be adjacent to the memory cell array 23c and aligned to the memory cell array 23c along a third direction 300' which is substantially opposite to the first direction 300. The area 21b may be disposed between the memory cell arrays 23a and 23b, adjacent to the memory cell array 23a and aligned to the memory cell array 23a along the first direction 300. The area 21b may be adjacent to the memory cell array 23b and aligned to the memory cell array 23b along the third direction 300'. The area 21c may be disposed between the memory cell arrays 23c and 23d, adjacent to the memory cell array 23c and aligned to the memory cell array 23c along the first direction 300. The area 21c may be adjacent to the memory cell array 23d and aligned to the memory cell array 23d along the third direction 300'. The areas 21a to 21c may extend in a second direction 310 perpendicular to the first direction 300. It may be possible to have substantially the same resistance between circuitry portions in the area 21b and 21c. For example, the areas 21b and 21c may be symmetrically spaced with respect to the area 21a. A distance between the areas 21a and 21b and a distance between the areas 21a and 21c may be substantially the same. A number of the plurality of through electrodes 25b and a number of the plurality of through electrodes 25c may be substantially the same.

Figure 3B:
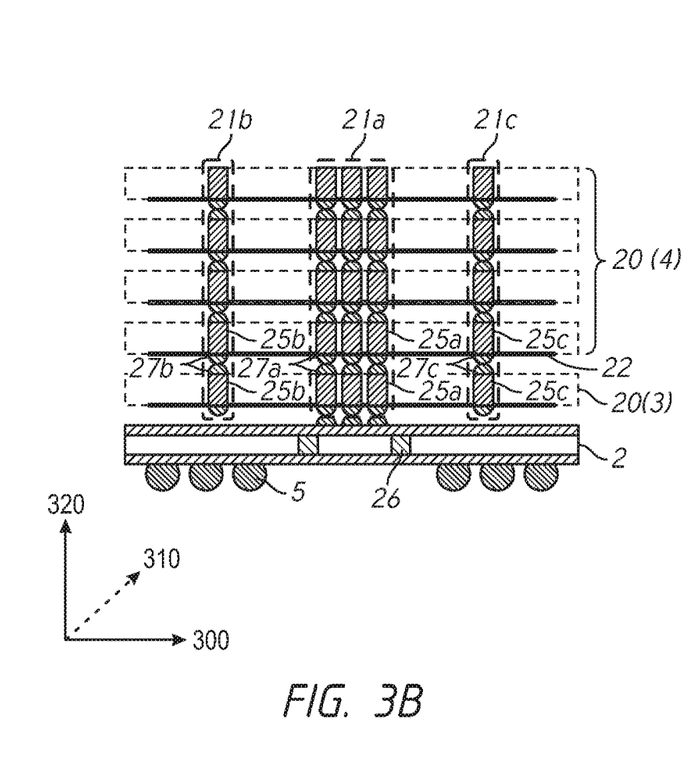
FIG. 3B is a schematic diagram of the semiconductor device including an interface chip and a plurality of core chips in FIG. 3A.

FIG. 3B is a schematic diagram of the semiconductor device including an interface chip and a plurality of core chips in FIG. 3A. FIG. 3B is a cross-sectional view of a portion of the semiconductor device indicated by X-X' of FIG. 3A. The cross-sectional view includes cross sections of the power supply through electrodes 25a to 25c disposed in the area 21a to 21c of FIG. 3A. The power supply through electrodes 25a to 25c may supply power supply voltage from the external terminals 5 through the substrate wirings 26 of the substrate 2 to the plurality of chips 20 (e.g., the interface chip 3 and the plurality of core chips 4, where a number of the plurality of core chips 4 is four). The plurality of power supply through electrodes 25a to 25c may be coupled by a plurality of terminals 27a to 27c in a series in a direction perpendicular to planes of the plurality of chips 20. For example, the plurality of terminals 27a to 27c may be coupling the plurality of power supply through electrodes 25a to 25c, respectively. The power supply through electrodes 25a to 25c in the areas 21a to 21c may supply the power supply voltage to the plurality of chips 20 through the power supply wirings 22.

Figure 3C:
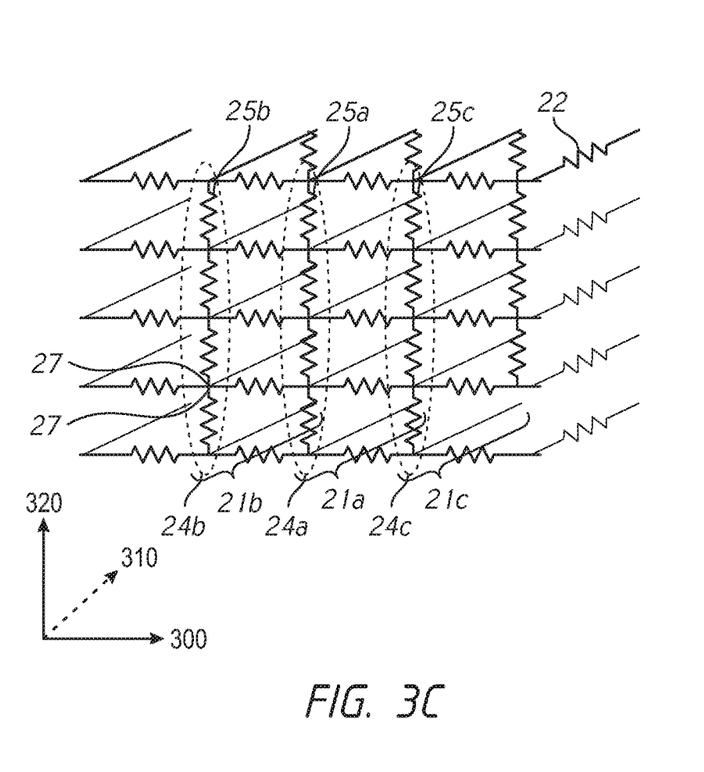
FIG. 3C is a schematic view of the power supply through electrodes and the power supply wirings in FIGS. 3A and 3B.

FIG. 3C is a schematic view of the power supply through electrodes and the power supply wirings in FIGS. 3A and 3B. In FIG. 3C, each of the power supply through electrodes 25a to 25c and the power supply wirings 22 may be modeled as a resistor. Each of the resistor groups 24a to 24c may include the plurality of power supply through electrodes 25a to 25c and a plurality of terminals 27 in the area 21a to 21c, respectively. The plurality of power supply through electrodes 25a are coupled by the plurality of terminals 27 in series along a fourth direction 320 that is perpendicular to the first direction 300 and the second direction 310. Similarly, the plurality of power supply through electrodes 25b are coupled in series along the fourth direction 320 by the plurality of terminals 27, and the plurality of power supply through electrodes 25c are coupled in series along the fourth direction 320 by the plurality of terminals 27. Because the areas 21a to 21c for the through electrodes 25a to 25c for power supply are disposed between the memory cell arrays 23a to 23d, a circuit (not shown) may be disposed between the through electrodes 25a and 25b or between the through electrodes 25a and 25c. For example, the circuit may be a step-down power-supply circuit or the like. The circuit between the memory cell arrays may supply power efficiently to the memory cell array in the memory cell arrays 23a to 23d.

As described above, the power supply through electrodes 25a to 25c may supply the power supply voltage to the plurality of chips 20 through the power supply wirings 22 disposed in a center area of each chip (e.g., the area 21a), but also through the power supply wirings 22 located in the areas 21b and 21c of FIGS. 3B and 3C. In this case, a resistance between the external terminals 5 and a portion at an electrically farther end (e.g., a circuitry portion at the chip end) becomes smaller when the wiring resistance on an identical chip is substantially the same, because additional electrical paths for power supply are provided by the power supply wirings located in the areas 21b and 21c. Thus, the additional electrical paths may reduce voltage drops due to power consumption in circuits on the plurality of chips 20 and therefore stabilize operations in the circuits.

Figure 4A:
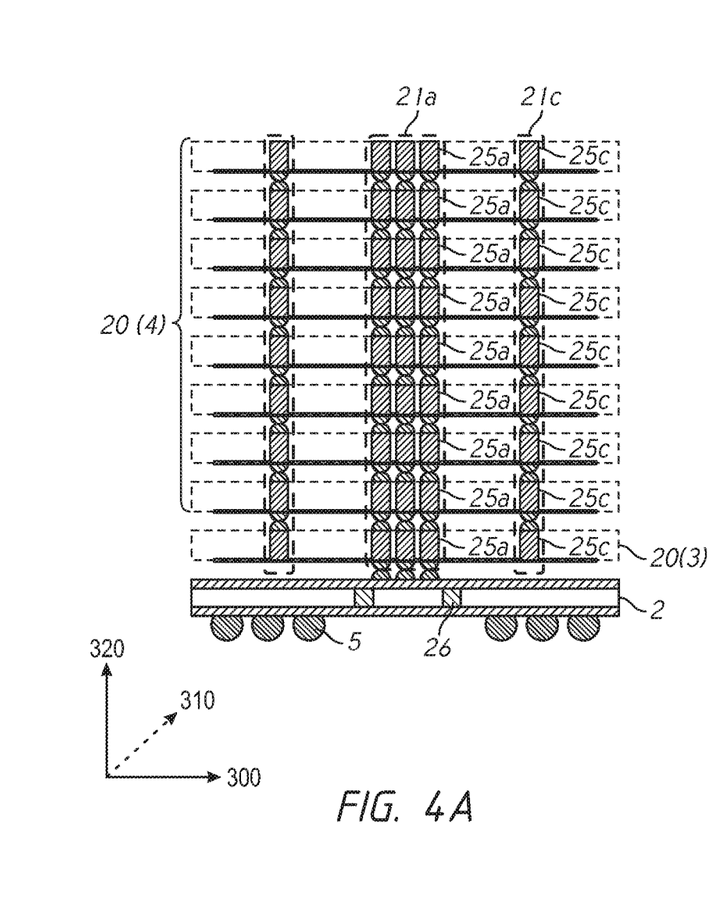
FIG. 4A is a schematic diagram of the semiconductor device including an interface chip and a plurality of core chips, in accordance with an embodiment of the present disclosure.

FIG. 4A is a schematic diagram of the semiconductor device including the interface chip and the plurality of core chips, in accordance with an embodiment of the present disclosure. A simplified layout view of each die of the semiconductor device may be similar to the simplified layout view of each die of the semiconductor device in FIGS. 3A to 3c and description of components corresponding to components included in FIGS. 2A and 3a to 3c will not be repeated and changes from FIGS. 2A and 3A to 3C including positional relationships between the components will be described. FIG. 4A is a cross-sectional view of a portion of the semiconductor device. The cross-sectional view includes cross sections of the power supply through electrodes 25a and 25c disposed in the area 21a and 21c of FIG. 3A. The power supply through electrodes 25a and 25c may supply power supply voltage from the external terminals 5 through the substrate wirings 26 of the substrate 2 to the plurality of chips 20 (e.g., the interface chip 3 and the plurality of core chips 4, where a number of the plurality of core chips 4 is eight).

Figure 4B:
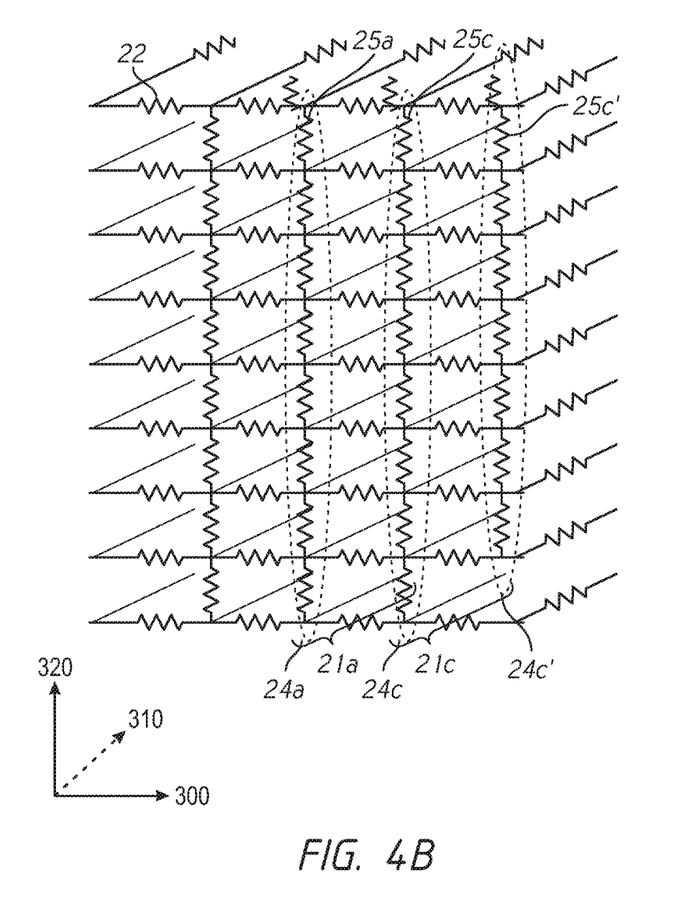
FIG. 4B is a schematic view of the power supply through electrodes and the power supply wirings in FIG. 4A.

FIG. 4B is a schematic view of the power supply through electrodes and the power supply wirings in FIG. 4A. In FIG. 4B, each of the power supply through electrodes 25a to 25c and the power supply wirings 22 may be modeled as a resistor. Each of the resistor group 24a may include the plurality of power supply through electrodes 25a in the area 21a, and each of the resistor groups 24c and 24c' may include the plurality of power supply through electrodes 25c and 25c' in the area 21c, respectively. The plurality of power supply through electrodes 25a are coupled in series along the fourth direction 320 by the plurality of terminals 27. Similarly, the plurality of power supply through electrodes 25c in the resistor groups 24c are coupled in series along the fourth direction 320 and the plurality of power supply through electrodes 25c' in the resistor groups 24c' are coupled in series along the fourth direction 320. As described above, the power supply through electrodes 25c and 25c' may supply the power supply voltage to the plurality of chips 20 through the through wirings disposed located in the area 21c of FIGS. 4A and 4B. In this case, a resistance between the external terminals 5 and a portion at an electrically farther end, such as a circuitry portion at the chip end and or a circuitry portion on upper chips becomes smaller when the wiring resistance on an identical chip is substantially the same, because additional electrical paths for power supply may be provided by the power supply wirings located in the area 21c on additional chips due to an increased number of stacked layers. Thus, the additional electrical paths may reduce voltage drops due to power consumption in circuits on the plurality of chips 20 and therefore stabilize operations in the circuits.

Figure 5A:
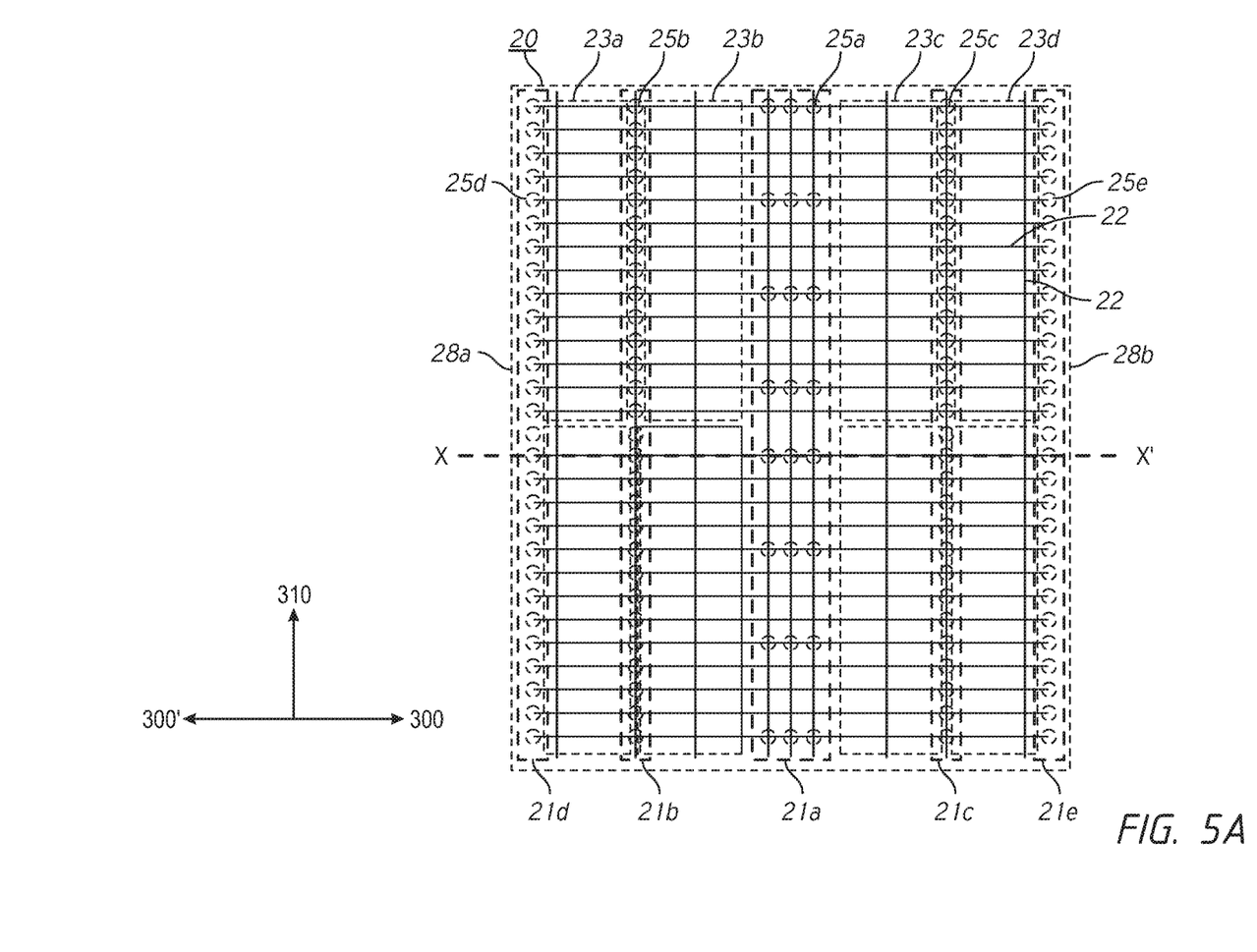
FIG. 5A is a simplified layout diagram of a chip including through electrodes in a semiconductor device, in accordance with an embodiment of the present disclosure.

FIG. 5A is a schematic diagram of a layout of through electrodes on a chip in a semiconductor device, in accordance with an embodiment of the present disclosure. Description of components corresponding to components included in FIGS. 2A and 3A will not be repeated and changes from FIGS. 2A and 3A including positional relationships between the components will be described. For example, the chip 20 may further include the through electrodes 25d and 25e disposed in areas 21d and 21e on the chip 20. The through electrodes 25d and 25e may be for power supply and coupled to the power supply wirings 22. The area 21d may be disposed between an end 28a and the memory cell array 23a, adjacent to the memory cell array 23a and aligned to the memory cell array 23a along the first direction 300. The area 21e may be disposed between an end 28b and the memory cell array 23d, adjacent to the memory cell array 23d and aligned to the memory cell array 23d along the third direction 300'. It may be possible to have substantially the same resistance between circuitry portions in the area 21d and 21e. For example, the areas 21d and 21e may be symmetric with respect to the area 21a. A distance between the areas 21a and 21d and a distance between the areas 21a and 21e may be substantially the same. A number of the plurality of through electrodes 25d and a number of the plurality of through electrodes 25e may be substantially the same.

Figures 5B, 5C:
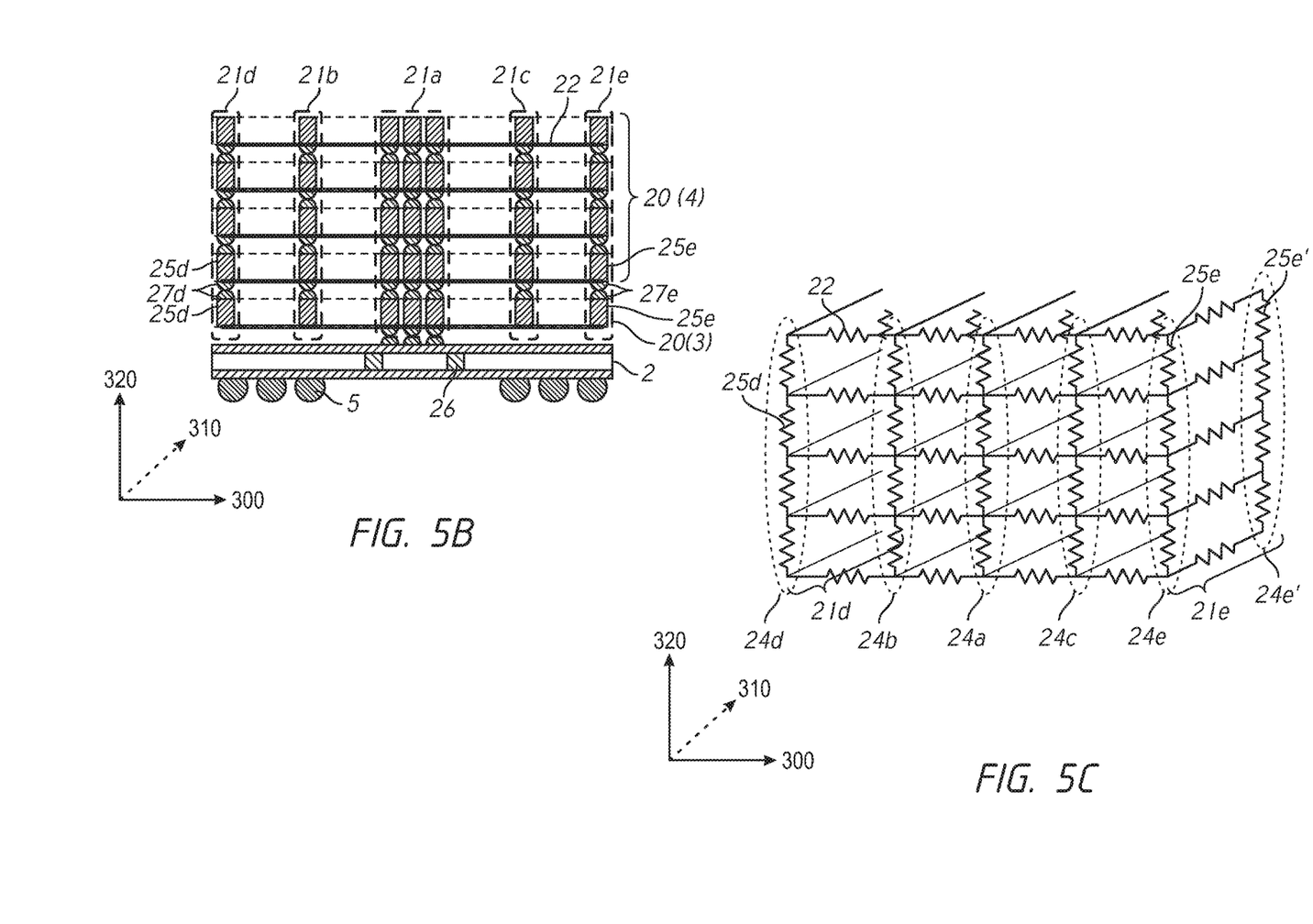
FIG. 5B is a schematic diagram of the semiconductor device including an interface chip and a plurality of core chips in FIG. 5A.
FIG. 5C is a schematic view of the power supply through electrodes and the power supply wirings in FIGS. 5A and 5B.

FIG. 5B is a schematic diagram of the semiconductor device including the interface chip and the plurality of core chips in FIG. 5A. FIG. 5B is a cross-sectional view of a portion of the semiconductor device indicated by X-X' of FIG. 5A. The cross-sectional view includes cross sections of the power supply through electrodes 25d and 25e disposed in the area 21d and 21e of FIG. 5A. The power supply through electrodes 25d and 25e may supply power supply voltage from the external terminals 5 through the substrate wirings 26 of the substrate 2 to the plurality of chips 20 (e.g., the interface chip 3 and the plurality of core chips 4).

FIG. 5C is a schematic view of the power supply through electrodes and the power supply wirings in FIGS. 5A and 5B. In FIG. 5C, each of the power supply through electrodes 25a to 25e and the power supply wirings 22 may be modeled as a resistor. Each of the resistor group 24d may include the plurality of power supply through electrodes 25d in the area 21d, and each of the resistor groups 24e and 24e' may include the plurality of power supply through electrodes 25e and 25e' in the area 21e, respectively. The plurality of power supply through electrodes 25d are coupled in series along the fourth direction 320 by the plurality of terminals 27. Similarly, the plurality of power supply through electrodes 25e in the resistor groups 24e are coupled in series along the fourth direction 320 and the plurality of power supply through electrodes 25e' in the resistor groups 24e' are coupled in series along the fourth direction 320. As described above, the power supply through electrodes 25e and 25e' may supply the power supply voltage to the plurality of chips 20 through the through wirings disposed located in the area 21e of FIGS. 5A and 5B. In this case, a resistance between the external terminals 5 and a portion at an electrically farther end, such as a circuitry portion at the ends of the plurality of chips 20 and or a circuitry portion on upper chips becomes smaller because additional electrical paths for power supply may be provided by through electrodes 25d, 25e, and 25e' in proximity of the ends 28a and 28b of the plurality of chips 20 located in the areas 21d and 21e. Thus, the additional electrical paths may reduce voltage drops due to power consumption in circuits on the plurality of chips 20 and therefore stabilize operations in the circuits.

Figure 6A:
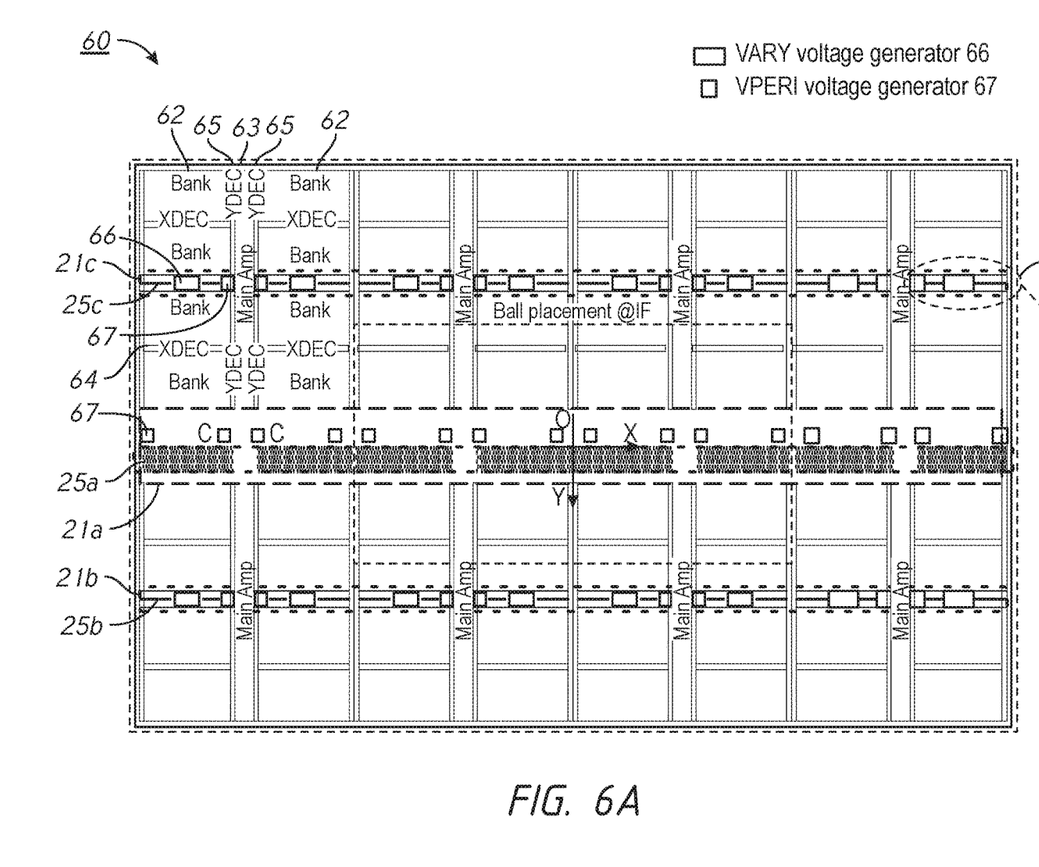
FIG. 6A is a simplified layout diagram of memory cell arrays of a chip in a semiconductor device, in accordance with an embodiment of the present disclosure.

FIG. 6A is a simplified layout diagram of memory cell arrays of a chip in a semiconductor device, in accordance with an embodiment of the present disclosure. Description of components corresponding to components included above will not be repeated and wirings are not shown in FIG. 6A. A memory cell array region 60 may include a plurality of banks 62. For example, column decoders 64 and row decoders 65 may be provided for each bank. A plurality of row decoders 65 may be disposed at sides of a main amplifier 63 in one direction of each bank. For example, each of memory cell arrays 23a to 23d may include the plurality of banks 62 divided by the row decoders 65 and the column decoders 64. The column decoders 64 may be disposed between the plurality of banks 62 in a direction substantially perpendicular to the one direction. The area 21a may include the power supply through electrodes 25a for power supply from the external terminals 5 and other through electrodes for communication via external terminals. The area 21c may include the power supply through electrodes 25c for power supply from the external terminals 5. The area 21a may include peripheral circuit voltage (VPERI) generators 67 that provide a peripheral voltage VPERI. The area 21c may include array-system circuit voltage (VARY) generators 66 that provide an array-system circuit voltage (VARY) and the VPERI generators 67. For example, the area 21c may include a portion 68 including the power supply through electrodes 25c, the VARY generator 66 and one VPERI generator 67.

Figure 6B:
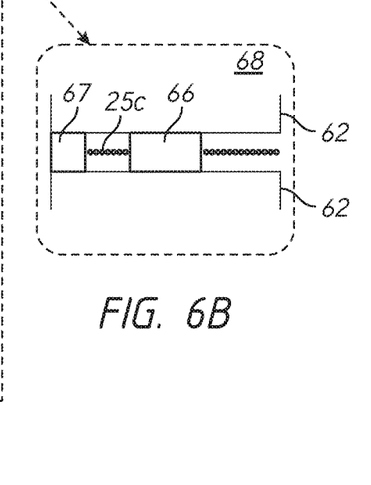
FIG. 6B is a layout diagram of the portion of the memory cell array of the chip of FIG. 6A.

FIG. 6B is a layout diagram of the portion 68 of the memory cell array of the chip of FIG. 6A. The portion 68 may be disposed between the plurality of banks 62 and may include the power supply through electrodes 25c, the VARY generator 66 and the VPERI generator 67. The VARY may be provided for sense amplifier circuits whereas the VPERI may be used among many circuits on the chip. For example, the VARY generator 66 and the VPERI generator 67 may provide the VARY and the VPERI that may be decoupled from each other. The VARY and the VPERI may be the same. The VARY and the VPERI may be different from each other. The VARY generator 66 and the VPERI generator 67 may be located adjacent to corresponding power supply through electrodes 25c supplied with an external power supply voltage $V_{DD}$ (not shown, e.g., 1.2V) and a ground voltage $V_{SS}$ (not shown, e.g., 0V). The VARY generator 66 may generate the VARY (e.g., about 1.0V) based on $V_{DD}$ and $V_{SS}$. The VPERI generator 67 may generate the VPERI (e.g., about 0.9V to 1.0V) based on $V_{DD}$ and $V_{SS}$. Thus, disposing the power supply through electrodes 25c in proximity to the VARY generators 66 and the VPERI generators 67 will reduce power consumption due to small resistance between the power supply through electrodes 25c and the VARY generators 66 or the VPERI generators 67 and therefore stabilize operations in circuits on the memory cell array. Similarly, the area 21b may include the VARY generator 66 and the VPERI generator 67 between a plurality of banks 62. The area 21b may include the power supply through electrodes 25b disposed in proximity to the VARY generators 66 and the VPERI generators 67 to achieve the similar effect as the power supply through electrodes 25c in the area 21c.

Figure 7:
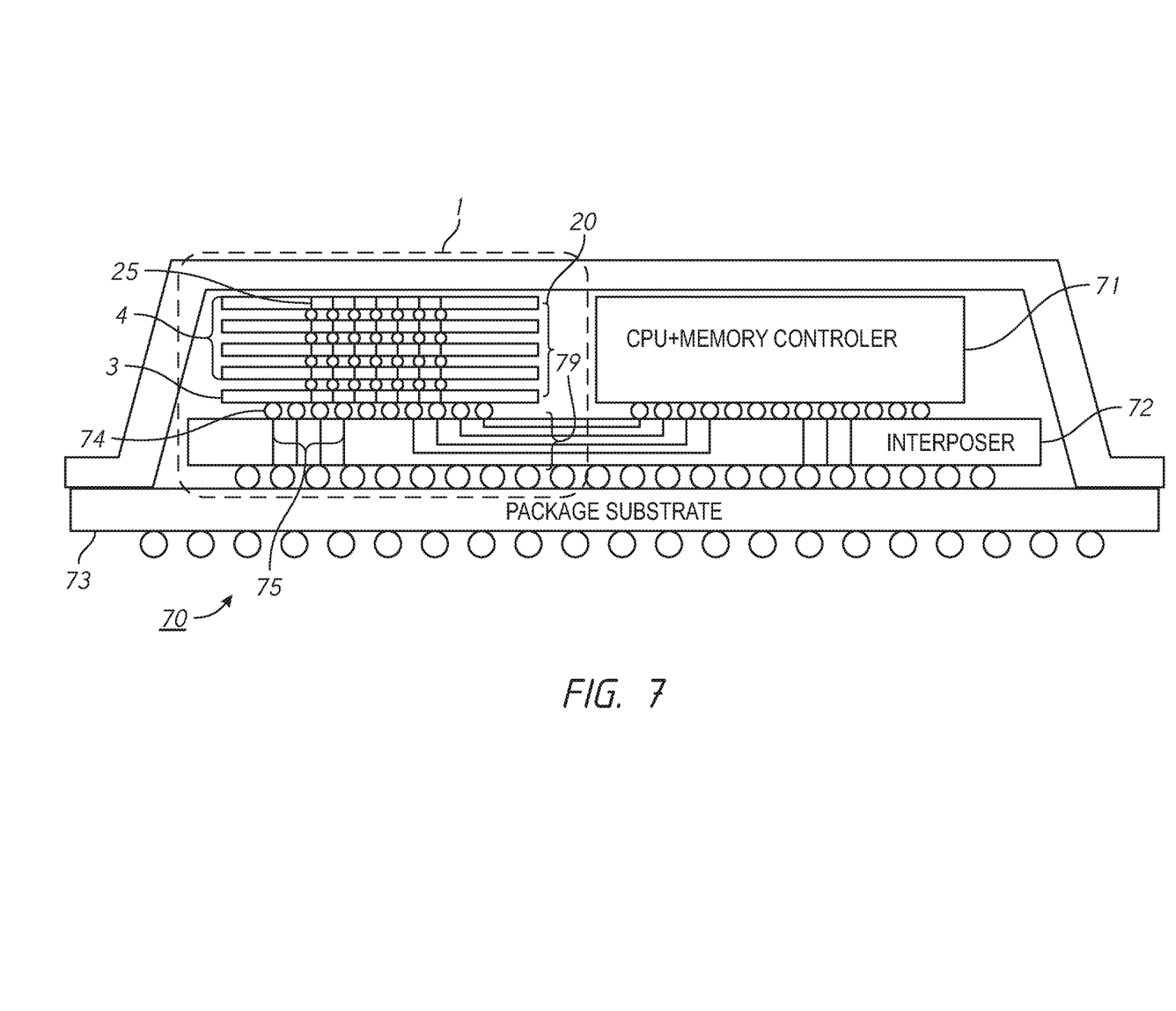
FIG. 7 is a schematic diagram of a semiconductor system including a semiconductor device that includes an interface chip and a plurality of core chips in accordance with an embodiment of the present disclosure.

FIG. 7 is a schematic diagram of a semiconductor system including a semiconductor device that includes an interface chip and a plurality of core chips, in accordance with an embodiment of the present disclosure. For example, the semiconductor system 70 may include a semiconductor device 1, which is a three-dimensional (3D) memory device, and a central processing unit (CPU) and memory controller 71, which may be a controller chip, on an interposer 72 on a package substrate 73. The interposer 72 may include one or more power lines 75 which supply power supply voltage from the package substrate 73. The interposer 72 includes a plurality of channels 79 that may interconnect the CPU and memory controller 71 and the semiconductor device 1. For example, the semiconductor device 1 may be an HBM, an HMC, a Wide-IO DRAM, etc. The semiconductor device 1 may include a plurality of chips 20 including an I/F chip 3 and core chips 4 stacked with each other. In this example, each core chip 4 may be a memory chip. Each of the memory chip 20 may include a plurality of memory cells and circuitries accessing the memory cells. For example, the memory cells may be DRAM memory cells. The semiconductor device 1 may include conductive vias TSVs 25 (e.g., through substrate electrodes) which couple the I/F chip 3 and core chips 4 by penetrating the I/F chip 3 and core chips 4. The I/F chip 3 may be coupled to the interposer 72 via interconnects, such as bumps 74. For example, the bumps 74 may be microbumps having bump pitches of less than about or less than one hundred micro meters and exposed on an outside of the I/F chip 3. A portion of the bumps 74 may be coupled to the one or more power lines 75. Another portion of the bumps 74 may be coupled to the plurality of channels 79.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:
1. An apparatus comprising:
    a chip extending on a plane defined by a first direction and a second direction perpendicular to the first direction, the chip comprising:
        a substrate;
        first, second and third memory cell arrays arranged in the first direction in the substrate;
        a plurality of first through electrodes arranged in line in the second direction between the first and second memory cell arrays; and
        a plurality of second through electrodes arranged in line in the second direction between the second and third memory cell arrays.
2. The apparatus of claim 1, further comprising a fourth memory cell array in the substrate and a plurality of third through electrodes arranged in line in the second direction between the third and fourth memory cell arrays.
3. The apparatus of claim 2, further comprising a plurality of fourth through electrodes arranged in parallel to the plurality of second through electrodes between the second and third memory cell arrays.
4. The apparatus of claim 3, further comprising a first voltage generator arranged between the first and second memory cell arrays and coupled to at least one of the plurality of first through electrodes, and
    wherein a second voltage generator arranged between the third and fourth memory cell arrays and coupled to at least one of the plurality of third through electrodes.
5. The apparatus of claim 4, wherein the first voltage generator is configured to generate a first voltage and the second voltage generator is configured to generate a second voltage equal to the first voltage.
6. The apparatus of claim 5, further comprising a third voltage generator arranged between the second and third memory cell arrays and coupled to at least one of the plurality of second through electrodes,
    wherein the third voltage generator is configured to generate a third voltage different from each of the first and second voltages.
7. The apparatus of claim 5, further comprising a third voltage generator arranged between the second and third memory cell arrays and coupled to at least one of the plurality of second through electrodes,
    wherein the third voltage generator is configured to generate a third voltage equal to each of the first and second voltages.
8. The apparatus of claim 6, further comprising:
    a fourth voltage generator arranged between the first and second memory cell arrays, coupled to the at least one of the plurality of first through electrodes and configured to generate a fourth voltage; and
a fifth voltage generator arranged between the third and fourth memory cell arrays, coupled to the at least one of the plurality of third through electrodes and configured to generate a fifth voltage,
wherein each of the fourth and fifth voltages is equal to the third voltage.

9. The apparatus of claim 2, further comprising a plurality of fourth through electrodes arranged in line in the second direction between a first side of the substrate and the first memory cell array and a plurality of fifth through electrodes arranged in line in the second direction between a second side opposing the first side of the substrate.

10. The apparatus of claim 9, wherein none of memory cell arrays are arranged between the first side of the substrate and the plurality of fourth through electrodes and between the second side of the substrate and the plurality of fifth through electrodes.

11. An apparatus comprising:
an interposer including a plurality of terminals, and
a first chip stacked on the interposer, the first chip including:
  a first substrate;
  a plurality of first through electrodes in the first substrate, the plurality of first through electrodes are physically coupled to the interposer via the plurality of terminals; and
  a plurality of second through electrodes in the first substrate, the plurality of second through electrodes are physically decoupled to the interposer; and
a second chip stacked on the first chip, the second chip including:
  a second substrate;
  first, second and third memory cell arrays arranged in line in the second substrate;
  a plurality of third through electrodes between the first and second memory cell arrays in the second substrate, each of the plurality of third through electrodes being coupled to and provided directly above a corresponding one of the plurality of second through electrodes; and
  a plurality of fourth through electrodes between the second and third memory cell arrays in the second substrate, each of the plurality of fourth through electrodes being coupled to and provided directly above a corresponding one of the plurality of first through electrodes.

12. The apparatus of claim 11, wherein the first chip further includes a plurality of fifth through electrodes in the first substrate, the plurality of fifth through electrodes are physically decoupled to the interposer, and
wherein the second chip further includes:
a fourth memory cell array in the second substrate; and
a plurality of sixth through electrodes between the third and fourth memory cell arrays in the second substrate, each of the plurality of sixth through electrodes being coupled to and provided directly above a corresponding one of the plurality of fifth through electrodes.

13. The apparatus of claim 12, wherein at least one of the plurality of terminals is supplied with a power voltage to supply the power voltage to at least one of the plurality of first through electrodes and at least one of the plurality of fourth through electrodes corresponding to the at least one of the plurality of first through electrodes, and
  wherein the first chip further includes a first wiring structure coupling the at least one of the plurality of first through electrodes to at least one of the plurality of second through electrodes and at least one of the plurality of fifth through electrodes.

14. The apparatus of claim 13, wherein the second chip further includes a second wiring structure coupling the at least one of the plurality of fourth through electrodes to at least one of the plurality of third through electrodes and at least one of the plurality of sixth through electrodes.

15. The apparatus of claim 12, wherein the first chip further includes a plurality of seventh through electrodes arranged along a first side of the first substrate and a plurality of eighth through electrodes arranged along a second side opposing the first side of the first substrate and each of the plurality of seventh and eighth through electrodes is physically decoupled to the interposer.

16. The apparatus of claim 15, wherein the second chip further includes a plurality of ninth through electrodes each coupled to and provided directly above a corresponding one of the plurality of seventh through electrodes and a plurality of tenth through electrodes each coupled to and provided directly above a corresponding one of the plurality of eighth through electrodes.

17. The apparatus of claim 16, wherein at least one of the plurality of terminals is supplied with a power voltage to supply the power voltage to at least one of the plurality of first through electrodes and at least one of the plurality of fourth through electrodes corresponding to the at least one of the plurality of first through electrodes, and
  wherein the first chip further includes a first wiring structure coupling the at least one of the plurality of first through electrodes to at least one of the plurality of second through electrodes, at least one of the plurality of fifth through electrodes, at least one of the plurality of seventh through electrodes and at least one of the plurality of eighth through electrodes.

18. The apparatus of claim 17, wherein the second chip further includes a second wiring structure coupling the at least one of the plurality of fourth through electrodes to at least one of the plurality of third through electrodes, at least one of the plurality of sixth through electrodes, at least one of the plurality of ninth through electrodes and at least one of the plurality of tenth through electrodes.

* * * * *